US010120054B2

United States Patent
Den Harder et al.

(10) Patent No.: US 10,120,054 B2
(45) Date of Patent: Nov. 6, 2018

(54) METAL RESISTANT MR IMAGING

(71) Applicant: KONINKLIJKE PHILIPS N.V., Eindhoven (NL)

(72) Inventors: Johan Michiel Den Harder, Eindhoven (NL); Marius Johannes Van Meel, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 45 days.

(21) Appl. No.: 14/917,594

(22) PCT Filed: Sep. 5, 2014

(86) PCT No.: PCT/EP2014/069012
§ 371 (c)(1),
(2) Date: Mar. 9, 2016

(87) PCT Pub. No.: WO2015/036340
PCT Pub. Date: Mar. 19, 2015

(65) Prior Publication Data
US 2016/0223635 A1 Aug. 4, 2016

(30) Foreign Application Priority Data

Sep. 10, 2013 (EP) ..................... 13183638

(51) Int. Cl.
*G01R 33/24* (2006.01)
*G01R 33/565* (2006.01)
(Continued)

(52) U.S. Cl.
CPC ..... *G01R 33/56536* (2013.01); *G01R 33/246* (2013.01); *G01R 33/385* (2013.01); *G01R 33/5611* (2013.01); *G01R 33/5615* (2013.01)

(58) Field of Classification Search
USPC ........................................ 324/309, 308, 317
See application file for complete search history.

(56) References Cited

U.S. PATENT DOCUMENTS 5,378,985 A * 1/1995 Hinks .............. G01R 33/56554
324/307
8,131,048 B2 3/2012 Li et al.
(Continued)

FOREIGN PATENT DOCUMENTS

WO 2005071429 A1 8/2005
WO 2012073151 A2 6/2012

OTHER PUBLICATIONS

Lu et al, "SEMAC: Slice Encoding for Metal Artifact Correction in MRI" Magentic Resonance in Med. 62 (2009) p. 66-76.
(Continued)

*Primary Examiner* — Vincent Q Nguyen

(57) ABSTRACT

A method and apparatus for parallel MR imaging include the steps of: —subjecting a portion of a body (10) to a first imaging sequence (21,22) of RF pulses and switched magnetic field gradients, wherein first MR signals (11,12) are acquired via at least two RF coils having different spatial sensitivity profiles within the examination volume, —deriving the spatial sensitivity profiles of the at least two RF coils from the acquired first MR signals, —subjecting the portion of the body to a second imaging sequence of RF pulses and switched magnetic field gradients, wherein second MR signals are acquired by parallel acquisition via the at least two RF coils with sub-sampling of k-space, and—reconstructing a MR image from the acquired second MR signals and from the spatial sensitivity profiles of the at least two RF coils. A type and/or parameters of the first imaging sequence are selected automatically depending on the presence of a metal implant in the body. The selection of the type of the first imaging sequence is made between a gradient echo sequence, if no metal implants are present, and a spin echo sequence or a stimulated echo sequence, if a metal implant is present.

15 Claims, 3 Drawing Sheets

(51) Int. Cl.
*G01R 33/561* (2006.01)
*G01R 33/385* (2006.01)

(56) References Cited

U.S. PATENT DOCUMENTS

| | | |
|---|---|---|
| 2006/0241378 A1 | 10/2006 | Purdy |
| 2010/0033179 A1 | 2/2010 | Hargreaves |
| 2010/0189328 A1 | 7/2010 | Boernert et al. |
| 2011/0241669 A1 | 10/2011 | Chen et al. |
| 2015/0253406 A1 | 9/2015 | Nehrke et al. |

OTHER PUBLICATIONS

Koch et al "Mavric Imaging Near Metal Implats With Improved Spatial Resolution.." Proc. Intl. Soc. Mag. Reson. Med 18 (2010) p. 892.

Chen et al "Parallel MRI Near Metallic Implants" Proc. Intl. Soc. Mag. Reson. Med. 17 (2009) p. 2783.

Nehrke et al "Dream a Novel Approach for Robust Ultrafast Multislice B1 Mapping" Magnetic Resonance in Med. 68: (2012) p. 1517-1526.

Hargreaves et al "Accelerated Slice Encoding for Metal Artifact Correction" Proc. Intl. Soc. Mag. Reson. Med. 17 (2009) p. 258.

Chung et al "3D Dark Blood MR Angiograpy of the Thoracic Vessels" Proc. Intl. Soc. Mag. Reson Med. 16 92008) p. 927.

McGowan et al "Reduction of Image Distortion in the Presence of Metal" Proc. Intl. Soc. Mag. Reson. Med. vol. 3, Apr. 12, 1997 p. 1973.

\* cited by examiner

METAL RESISTANT MR IMAGING

CROSS REFERENCE TO RELATED APPLICATIONS

This application is a U.S. national phase application of International Application No. PCT/EP2014/069012, filed on Sep. 5, 2014, which claims the benefit of EP Application Serial No. 13183638.9 filed on Sep. 10, 2013 and is incorporated herein by reference.

FIELD OF THE INVENTION

The invention relates to the field of magnetic resonance (MR) imaging. It concerns a method of MR imaging of at least a portion of a body. The invention also relates to a MR device and to a computer program to be run on a MR device.

The international application WO2005/071429 addresses to problem of distortions in the calibration (reference) scan (for coil sensitivity estimation) due to rapid magnetic field changes. This known approach resolves this problem by applying a spin echo type of short echo time gradient echo type acquisition for the calibration scan. Further, the phase-encoding direction for the parallel imaging scan is matched to the phase encoding direction of the calibration scan.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field ($B_0$ field) whose direction at the same time defines an axis (normally the z-axis) of the co-ordinate system in which the measurement is based. The magnetic field splits different energy levels for the individual nuclear spins in dependence on the magnetic field strength and the specific spin properties. The spin system can be excited (spin resonance) by application of an electromagnetic alternating field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an above mentioned electromagnetic pulse of appropriate radio frequency (RF pulse) while the corresponding $B_1$ magnetic field extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic RF pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. The k-space data are usually acquired along multiple lines with different phase encoding values to achieve sufficient coverage. Each line is digitized during read-out by collecting a number of samples. A set of k-space data is converted to a MR image by means of Fourier transformation.

With aging population and an increasing number of patients carrying metal implants, the need for MR imaging of soft tissue in the presence of metal increases. Metal resistant MR imaging is required to enable imaging this soft tissue for diagnosis of complications and follow-up after surgery. MR imaging near metal is typically compromised by susceptibility issues degrading the magnetic fields used for image formation locally. In diagnostic MR imaging scans, the susceptibility of the metal parts causes MR signal pile-up, signal voids and other geometric distortions. Multispectral imaging techniques like SEMAC (Lu et al, ISMRM 2008, p. 838) and MAVRIC (Koch et al, ISMRM 2008, p. 1250) have been proposed to counter susceptibility issues in diagnostic MR imaging scans at the cost of increased scan duration, which scales with the required frequency coverage.

Known parallel acquisition techniques can be used for accelerating the multispectral MR signal acquisition. A method in this category is SENSE (Sensitivity Encoding). SENSE and other parallel acquisition techniques use under-sampled k-space data acquisition obtained from multiple RF receiving coils in parallel. In these methods, the (complex) signal data from the multiple RF receive coils are combined with complex weightings in such a way as to suppress undersampling artifacts (aliasing) in the finally reconstructed MR images. This type of complex RF coil array signal combination is sometimes referred to as spatial filtering and includes combining in the k-space domain or in the image domain (in SENSE), as well as methods which are hybrids. In SENSE imaging, coil sensitivity profiles are typically estimated from low-resolution reference data obtained by a SENSE reference scan. This coil sensitivity information is then used to "unwrap" aliased pixels in image space using a direct inversion algorithm.

The present standard for the SENSE reference scan is a gradient echo sequence, namely a FFE (Fast Field Echo=gradient echo with small flip-angle excitation) acquisition protocol, which makes it very sensitive to susceptibility effects. When the susceptibility of metal parts compromises the quality of the SENSE reference scan, it may cause SENSE unfolding problems and signal voids resulting in an insufficient quality of the finally reconstructed MR images.

Conventionally, the MR device employed for a given diagnostic imaging task automatically detects when a SENSE reference scan is required depending on the type and the parameters of the selected imaging sequence. The SENSE reference scan is automatically inserted into the list of sequences to be performed, typically immediately before the diagnostic imaging sequence.

Using a spin echo sequence, namely a TSE (Turbo Spin Echo=spin echo with multiple 180° refocusing RF pulses) SENSE reference scan has been shown to be more robust against susceptibility effects, thereby reducing problems like incorrect SENSE unfolding and signal voids. However, a TSE SENSE reference scan may take a full minute or more, which is substantially longer than the standard FFE SENSE reference scan, which takes typically less than 10 seconds.

It is generally not known a priori if a patient to be examined has a metal implant or not. It would be inefficient to precautionary employ a metal resistant SENSE reference scan in order to avoid image artefacts. In many cases, a conventional SENSE reference scan is sufficient.

From the foregoing it is readily appreciated that there is a need for an efficient MR imaging technique that is robust against susceptibility effects.

SUMMARY OF THE INVENTION

In accordance with the invention, a method of MR imaging of at least a portion of a body placed in the examination volume of a MR device is disclosed. The method comprises the steps of:

subjecting the portion of the body to a first imaging sequence of RF pulses and switched magnetic field gradients, wherein first MR signals are acquired via at least two RF coils having different spatial sensitivity profiles within the examination volume, deriving the spatial sensitivity profiles of the at least two RF coils from the acquired first MR signals, subjecting the portion of the body to a second imaging sequence of RF pulses and switched magnetic field gradients, wherein second MR signals are acquired by parallel acquisition via the at least two RF coils with sub-sampling of k-space, and reconstructing a MR image from the acquired second MR signals and from the spatial sensitivity profiles of the at least two RF coils, wherein the type and/or parameters of the first imaging sequence are selected automatically depending on the presence of a metal implant in the body.

According to the invention, the (diagnostic) MR image is reconstructed, for example, by using the SENSE, SMASH or GRAPPA algorithm, from the second MR signals acquired by parallel (i.e. accelerated) imaging using sub-sampling and from the spatial sensitivity profiles derived from the acquisition of the first MR signals. In order to enable fast imaging, the image resolution of the first imaging sequence (reference scan) can be chosen to be lower than the image resolution of the second imaging sequence (diagnostic scan). The reference scan may be performed prior to or after the diagnostic scan.

It is the gist of the invention to automatically select the type and/or parameters of the first imaging sequence depending on the presence of metal implants in the body. In other words, a metal resistant reference scan, like, for example, a TSE-based reference scan is automatically employed in case the examined patient has a metal implant. This renders the method of the invention robust against susceptibility effects. Simultaneously, the approach of the invention is (time) efficient since a (time-consuming) metal resistant reference scan is employed only if necessary. A (fast) conventional reference scan is employed automatically in the absence of metal implants.

In a preferred embodiment of the invention, the presence of a metal implant is determined from a manual input of a user of the MR device. During the initialisation of the examination, the user may enter into the control software of the MR device that the patient has or may have a metal implant. In this case, the system automatically selects a metal resistant variant of the first imaging sequence for determining the spatial sensitivity profiles of the RF coils.

In an alternative embodiment, the presence of a metal implant is deduced from the preset type of the second imaging sequence. If, for example, the user selects a metal resistant sequence for the diagnostic scan, such as a MAVRIC, SEMAC or a high-bandwidth spin echo sequence, the system automatically deduces that a metal resistant variant of the first imaging sequence for determining the spatial sensitivity profiles of the RF coils is required.

According to yet another preferred embodiment, the presence of a metal implant is determined from a MR spectrum acquired from the portion of the body. If, for example, an initial survey scan of the body of the patient is performed to establish the resonance frequence ($F_0$) and a significant spread of the signal around the Larmor frequency is found, this can be used as an indication that the patient has a metal implant and a metal resistant variant of the reference scan is automatically selected.

In an embodiment of the invention, the selection of the type of the first imaging sequence is made between a gradient echo sequence, if no metal implants are present, and a spin echo sequence or a stimulated echo sequence, if a metal implant is present. As mentioned above, a gradient echo sequence, such as a FFE acquisition protocol, is the standard for the SENSE reference scan. This sequence allows a fast acquisition of the spatial sensitivity profiles of the used RF coils, but it is very sensitive to susceptibility effects. When the system determines that a metal resistant SENSE reference scan is required it may select a spin echo sequence, such as, for example, a TSE SENSE reference scan which is more robust against susceptibility effects.

In a preferred embodiment of the invention, a stimulated echo sequence may be selected as a metal resistant SENSE reference scan. In general, a stimulated echo sequence comprises three (for example 60° or 90°) RF pulses, wherein the first two RF pulses are preparation pulses. The first preparation RF pulse excites magnetic resonance and transforms the longitudinal nuclear magnetization into transverse nuclear magnetization. The second preparation RF pulse stores a fraction of the de-phased transverse nuclear magnetization along the longitudinal axis. In case of 90° RF pulses this fraction is almost half of the de-phased transverse magnetization. The third RF pulse is applied during the acquisition period which is temporally subsequent to the preparation period. The third RF pulse ("reading RF pulse") transforms the stored longitudinal nuclear magnetization into transverse nuclear magnetization again, thereby generating a so-called stimulated echo. Furthermore, it generates a FID signal from the remaining longitudinal magnetisation. Other RF refocused echoes could potentially be generated by this three RF pulse sequence, but those are not of interest here and may be suppressed by appropriate gradient switching regimes running in parallel to the RF irradiation. The stimulated echo MR signal together with the FID signal, which is also generated by the third RF pulse, is acquired according to the invention. MR imaging on the basis of the stimulated echoes can be accelerated by replacing the third RF pulse by a train of low-flip angle reading RF pulses, wherein each reading RF pulse refocuses only a small portion of the longitudinal nuclear magnetization stored after the preparation period. With appropriate parameters, the stimulated echo sequence of the invention is robust against susceptibility effects. According to the invention, the stimulated echo sequence with acquisition of the FID signals and the stimulated echo signals may be used as SENSE reference scan for MR imaging near metal. In addition to RF receive coil sensitivity information, the stimulated echo sequence also provides information about $B_0$ distribution and transmit $B_1$ distribution. One MR image can be reconstructed from the FID signals and another MR image can be reconstructed from the stimulated echo signals. After the MR image reconstruction, a transmit $B_1$ map can be derived from the voxel-wise intensity ratio of the two MR images reconstructed from the FID and stimulated echo signals, respectively. A plurality of FID signals and stimulated echo signals with appropriate phase encoding need to be acquired for generating a complete $B_1$ map (receive and/or transmit sensitivities). Moreover, a $B_0$ map indicating the spatial distribution of the main magnetic field within the portion of the body can be derived from the acquired FID and stimulated echo signals as well. It turns out that, by using appropriate parameters of the imaging sequence, not only a $B_1$ map, but also a $B_0$ map can be derived from the voxel-wise intensities of the FID and stimulated echo signals. It is an advantage of the stimulated echo sequence that a $B_1$ map and a $B_0$ map can be acquired simultaneously without additional measurement steps. Therefore, as an additional value of the invention, without any additional scan time, the $B_0$ distribution information of the sequence can be used for automated determination of the required frequency coverage of subsequent diagnostic scans. The (multispectral) scan protocol can then (automatically) be adapted to meet this required frequency coverage in the minimal required scan duration. As the $B_0$ distribution is spatially dependent, it is even possible, if desired, to adapt the (multispectral) scan protocol to meet the required frequency coverage per slice.

Preferably, the first MR signals are acquired via the at least two RF coils having different spatial receive sensitivity profiles and, in parallel or sequentially, via at least one volume RF coil having a substantially homogeneous spatial sensitivity profile within the examination volume, wherein the spatial receive sensitivity profiles of the RF coils are derived by comparing the signals acquired via RF coils having different spatial sensitivity profiles with the signals acquired via the volume RF coil. For example, the signal acquisition according to the first imaging sequence may be repeated, at least two times, in the first acquisition using the volume RF coil for reception in the second using the RF coils having different spatial sensitivities. Moreover, the receive RF coil sensitivity mapping can be performed according to the invention in a single acquisition step, using the volume RF coil and the RF coils having different receive sensitivity profiles (e.g. array RF coils) simultaneously, provided a sufficient RF coil decoupling can be achieved.

In accordance with a preferred embodiment of the invention, the second imaging sequence is a multispectral imaging sequence. The above referenced multispectral imaging techniques like SEMAC and MAVRIC can be used in order to enable MR imaging near metal parts. The scan duration can be kept within reasonable limits by using parallel imaging in combination with a metal resistant reference scan according to the invention.

In accordance with yet another preferred embodiment of the invention, the first imaging sequence is a spin echo sequence including a view-angle-tilting magnetic field gradient activated during acquisition of the first MR signals. The use of view-angle-tilting to reduce adverse effects from magnetic field inhomogeneities (for example caused by susceptibility variations near metal implants) is known per se in the art. View-angle-tilting uses a magnetic field gradient applied in the slice-selection direction during readout, i.e. during acquisition of the first MR signals, typically with a gradient amplitude equal to that of the slice-selection magnetic field gradient. The respective image slice is then effectively viewed at an angle that equals arctan $(G_z/G_x)$, wherein $G_x$ is the readout (frequency-encoding) magnetic field gradient and $G_z$ is the slice-selection magnetic field gradient. When viewed at this angle, shifts in the slice selection plane compensate for shifts during readout, such that in-plane shifts are re-registered. The introduction of view-angle-tilting in the spin echo sequence according to the invention renders the reference scan yet more metal resistant since inhomogeneity-induced artefacts are further reduced.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention is preferably implemented by a corresponding programming of the reconstruction unit and/or the control unit of the MR device.

The methods of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
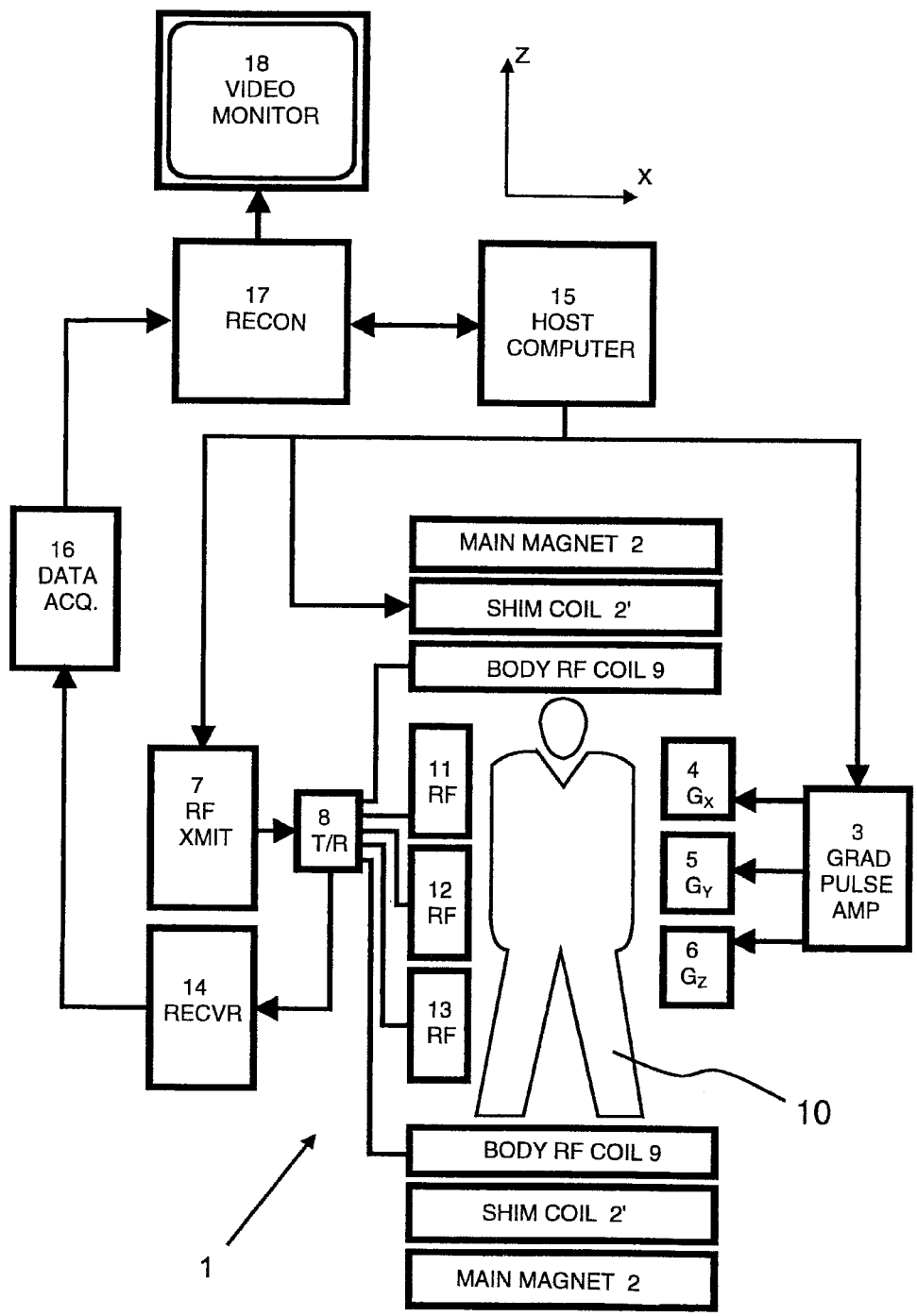
FIG. 1 schematically shows a MR device for carrying out the methods of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients (also referred to as 'gradient pulses') to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a-body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite magnetic resonance, invert magnetization, refocus resonance, or manipulate resonance and select a portion of a body 10 positioned in the examination volume.

For generation of MR images of regions of the body 10 by means of parallel imaging, a set of local array RF coils 11, 12, 13 are placed contiguous to the region selected for imaging. The array RF coils 11, 12, 13 are used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the current flow through the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies appropriate reconstruction algorithms, such like SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
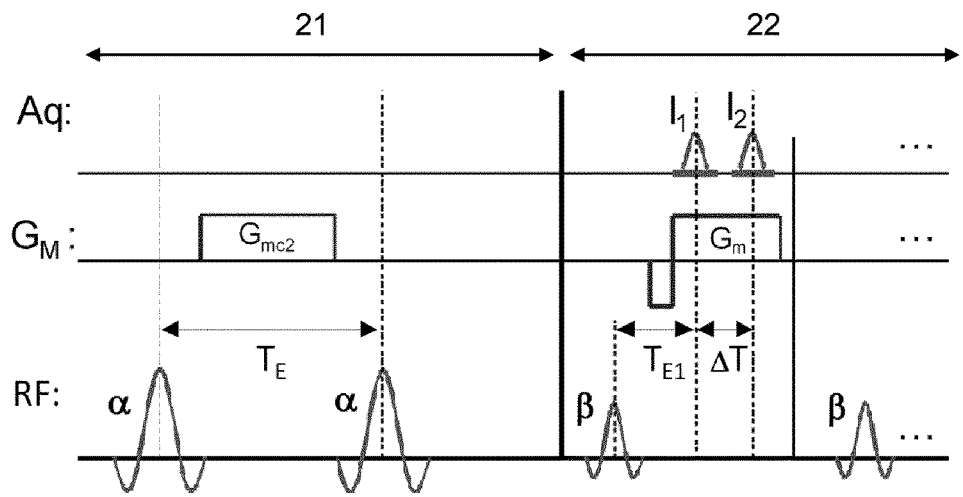
FIG. 2 shows a diagram illustrating an embodiment of the first imaging sequence according to the invention.

FIG. 2 shows a schematic diagram illustrating a first imaging sequence according to the invention which is applied as a SENSE reference scan. The depicted imaging sequence is a stimulated echo sequence which is subdivided into a preparation period 21 and an acquisition period 22. Two preparation RF pulses having a flip angle of α are applied during the preparation period 21. The two preparation RF pulses are separated by a time interval $T_E$. A de-phaser magnetic field gradient $G_{mc2}$ is applied between the two preparation RF pulses. A sequence of reading RF pulses having flip-angle β are generated during the acquisition period 22, which is temporally subsequent to the preparation period 21. An FID signal $I_1$ and a stimulated echo signal $I_2$ are acquired after each reading pulse as gradient-recalled echoes.

The (unknown) flip angle α of the stimulated echo preparation RF pulses (and thus the transmit $B_1$ map of the used transmit coil) can be derived from the ratio of the acquired echo signals according to:

$$\alpha = \arctan \sqrt{2|I_2/I_1|}$$

The mirrored phase of the stimulated echo signal $I_2$ may be further employed to derive a $B_0$ phase map:

$$\varphi_{B_0} = \arg(I_1 \cdot I^*_2)$$

Figure 3:
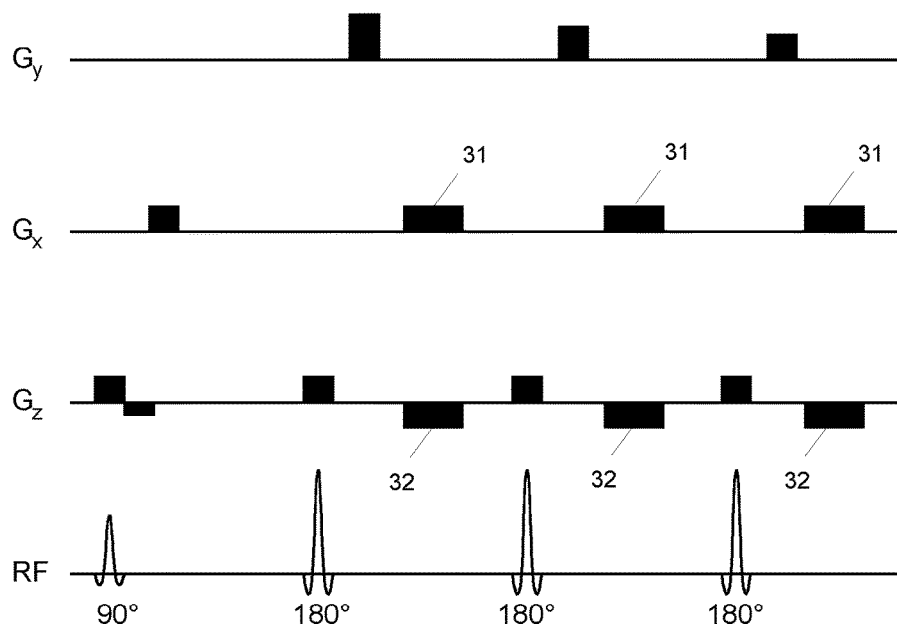
FIG. 3 shows a diagram illustrating another embodiment of the first imaging sequence according to the invention.

FIG. 3 shows an alternative scheme that may be applied in accordance with the invention as a first imaging sequence. In the timing diagram, a turbo spin echo (TSE) sequence is illustrated. The sequence is characterized by a series of rapidly applied 180° re-phasing RF pulses and multiple echoes (not depicted) with a changing phase encoding gradient $G_y$ for each echo. Each echo signal is acquired in the presence of a frequency-encoding magnetic field gradient $G_x$ designated by reference number 31 in FIG. 3. The sequence further includes view-angle-tilting magnetic field gradients $G_z$ (designated by 32) activated during acquisition of the spin echo signals. The use of view-angle-tilting reduces adverse susceptibility effects near metal implants. The magnetic field gradients 32 are applied in the slice-selection direction. The respective image slice is then effectively viewed at an angle, whereby susceptibility-induced distortions in the slice selection plane are effectively compensated for.

The MR signal acquisition by means of the first imaging sequence (according to any one of the embodiments shown in FIGS. 2 and 3) is repeated, at least two times, in the first acquisition using the body RF coil 9 for reception in the second using the array RF coils 11, 12, 13. The receive RF coil sensitivity profiles are then derived from a comparison of the MR signals received via the body RF coil 9 and via the array RF coils 11, 12, 13.

After application of the first imaging sequence as a SENSE reference scan, a second imaging sequence (not depicted) is performed as a diagnostic scan with sub-sampling of k-space. The corresponding diagnostic MR image is then reconstructed, by using the SENSE algorithm, from the second MR signals acquired during the diagnostic scan and from the spatial sensitivity profiles derived from the first MR signals of the reference scan. The second imaging sequence can be a multispectral imaging sequence in order to improve MR image quality near metal parts. Though multispectral imaging sequences are typically associated with long scan durations, the scan duration is kept within reasonable limits by using SENSE parallel imaging in combination with a reference scan, which is fast and robust against susceptibility effects, as described above.

Figure 4:
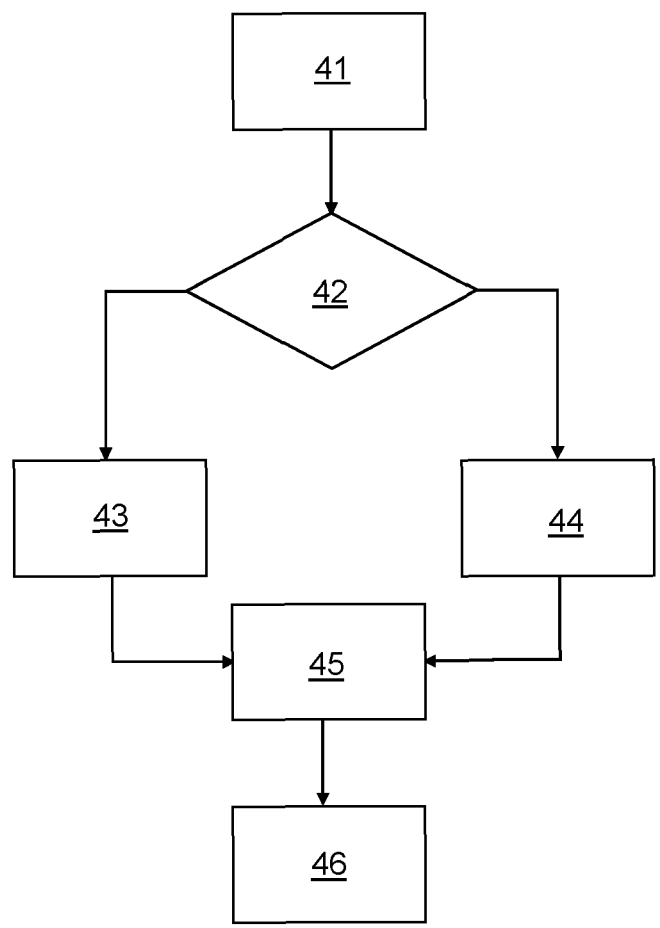
FIG. 4 shows a block diagram illustrating the method of the invention.

In the block diagram illustrated in FIG. 4, the method of the invention starts with an initial survey scan 41 of the body 10 to establish the resonance frequence ($F_0$). The presence of a metal implant is determined in step 42 from the MR spectrum acquired in step 41. If, for example, a significant spread of the signal around the Larmor frequency is found in the MR spectrum, this is an indication that the patient has a metal implant, and a metal resistant variant of the reference scan is automatically employed in step 43. If no significant spead is detected in the MR spectrum, it is assumed that the patient has no metal implant and a conventional SENSE reference scan, such as, for example a FFE sequence, is employed in step 44. In step 45, the actual diagnostic scan is performed. The corresponding diagnostic MR image is reconstructed in step 46 from the second MR signals acquired in step 45 and from the spatial sensitivity profiles derived from the first MR signals acquired in step 43 or 44.

The invention claimed is:

1. A method of magnetic resonance (MR) imaging of at least a portion of a body placed within the examination volume of a MR device, the method comprising the steps of:
   controlling a gradient magnetic field coil and at least two RF coils to subject the portion of the body to a first imaging sequence of RF pulses and switched magnetic field gradients and acquiring first MR signals via the at least two RF coils, the at least two RF coils having different spatial sensitivity profiles within the examination volume,
   deriving the spatial sensitivity profiles of the at least two RF coils from the acquired first MR signals,
   controlling the gradient magnetic field coil and the at least two RF coils to subject the portion of the body to a second imaging sequence of RF pulses and switched magnetic field gradients and acquiring second MR signals by parallel acquisition via the at least two RF coils with sub-sampling of k-space, and
   reconstructing a MR image of the portion of the body from the acquired second MR signals and from the spatial sensitivity profiles of the at least two RF coils,
   wherein a type and/or parameters of the first imaging sequence are selected automatically depending on the presence of a metal implant in the body,
   wherein the presence of the metal implant is one of:
      determined from a manual input of a user of the MR device,
      deduced from a type of the second imaging sequence, or
      determined from a MR spectrum acquired from the portion of the body; and
   controlling a display device to display the reconstructed MR image of the portion of the body.

2. A method of magnetic resonance (MR) imaging of at least a portion of a body placed within an examination volume of a MR device, the method comprising:
   with a host computer, controlling a gradient magnetic field coil and at least two RF coils to subject the portion of the body to a first imaging sequence of RF pulses and switched magnetic field gradients and acquire first MR signals via the at least two RF coils, the at least two RF coils having different spatial sensitivity profiles within the examination volume,
   with the host computer, deriving the spatial sensitivity profiles of the at least two RF coils from the acquired first MR signals,
   with the host computer controlling a gradient magnetic field coil and at least two RF coils to subject the portion of the body to a second imaging sequence of RF pulses and switched magnetic field gradients, wherein second MR signals are acquired by parallel acquisition via the at least two RF coils with sub-sampling of k-space,
   with a reconstruction processor, reconstructing a MR image of at least the portion of the body from the acquired second MR signals and from the spatial sensitivity profiles of the at least two RF coils,
   determining a presence of a metal implant in the body portion, wherein the first imaging sequence is selected to be:
      a gradient echo sequence, if no metal implants are determined to be present in the portion of the body, and
      a spin echo sequence or a stimulated echo sequence, if metal implants are determined to be present in the portion of the body.

3. The method of claim 2, wherein the first imaging sequence is a stimulated echo sequence including:
   i) at least two preparation RF pulses radiated toward the portion of the body during a preparation period, and
   ii) one or more reading RF pulses radiated toward the portion of the body during an acquisition period temporally subsequent to the preparation period;
   acquiring one or more FID signals (I1) and one or more stimulated echo signals (I2) during the acquisition period by parallel signal acquisition via the at least two RF coils; and
   deriving the spatial sensitivity profiles of the at least two RF coils from the acquired FID signals and/or from the acquired stimulated echo signals.

4. The method of claim 2, wherein the first imaging sequence is a spin echo sequence including a view-angle-tilting magnetic field gradient activated during acquisition of the first MR signals.

5. The method of claim 1, wherein the MR image is reconstructed by using a SENSE or a SMASH or a GRAPPA algorithm.

6. The method of claim 1, wherein the second imaging sequence is a multispectral imaging sequence.

7. A magnetic resonance (MR) device comprising:
   at least one main magnet coil configured to generate a steady magnetic field within an examination volume
   a plurality of gradient coils configured to generate switched magnetic field gradients in different spatial directions within the examination volume;
   a plurality of RF coils including at least one RF coil configured to transmit RF pulses into the examination volume and at least two RF coils having different spatial sensitivity profiles within the examination volume configured to receive MR signals from at least a portion of a body of a patient positioned in the examination volume;
   a control processor configured to:
      determine whether a metal implant is disposed in the portion of the body,
      select a first imaging sequence and parameters of the first imaging sequence from a plurality of imaging sequences and parameters in response to determining whether a metal implant is present in the portion of the body,
      control the gradient and RF coils to subject the portion of the body to the selected first imaging sequence of RF pulses and switched magnetic field gradients to repeatedly induce first MR signals in the portion of the body,
      control the at least two RF coils having different spatial sensitivity profiles within the examination volume to acquire the first MR signals,
      derive the spatial sensitivity profiles of the at least two RF coils from the acquired first MR signals, control the gradient and RF coils to subject the portion of the body to a second imaging sequence of RF pulses and switched magnetic field gradients to induce second MR signals in the portion of the body, control the at least two RF coils to acquire the second MR signals by parallel signal acquisition with sub-sampling of k-space;

a reconstruction processor configured to reconstruct a MR image from the acquired second MR signals and from the spatial sensitivity profiles of the at least two RF coils; and a monitor configured to display the reconstructed MR image.

8. A non-transitory computer readable medium carrying computer software which when run on one or more processors of a magnetic resonance (MR) device, controls the MR device to:

determine whether or not a metal implant is in a portion of a body, select a first imaging sequence from a plurality of imaging sequences based on determining whether or not the metal implant is in the portion of the body, generate the selected first imaging sequence of RF pulses and switched magnetic field gradients to generate first MR signals, wherein the first MR signals are acquired via at least two RF coils having different spatial sensitivity profiles within the examination volume, derive the spatial sensitivity profiles of the at least two RF coils from the acquired first MR signals, generate a second imaging sequence of RF pulses and switched magnetic field gradients to generate the second MR signals, wherein the second MR signals are acquired by parallel signal acquisition via the at least two RF coils with sub-sampling of k-space, reconstruct a MR image from the acquired second MR signals and from the spatial sensitivity profiles of the at least two RF coils, and control a monitor to display the reconstructed MR image.

9. The MR device of claim 7, wherein the selected first imaging sequence is a spin echo sequence or a stimulated echo sequence when a metal implant is determined to be in the portion of the body.

10. The MR device of claim 7, wherein the control processor is further configured to select a gradient echo sequence in response to determining that a metal implant is not present in the portion of the body.

11. The MR device of claim 7, wherein the plurality of imaging sequences include a gradient echo sequence, a spin echo sequence, and a stimulated echo sequence.

12. The MR device of claim 11, wherein the control processor is configured to select the gradient echo sequence when no metal implant is determined to be present in the portion of the body and to select one of the spin echo and stimulated echo sequences when a metal implant is determined to be in the portion of the body.

13. The MR device of claim 7, wherein the presence of the metal implant is determined:
from a manual input,
based on the second imaging sequence, or
from an MR spectrum acquired from the portion of the body.

14. The non-transitory computer-readable medium of claim 8 wherein the plurality of imaging sequences include a gradient echo sequence, a spin echo sequence, and a stimulated echo sequence, and wherein the one or more processors are further controlled by the software to select the gradient echo sequence when no metal implant is determined to be present in the portion of the body and to select one of the spin echo and stimulated echo sequences when a metal implant is determined to be in the portion of the body.

15. The non-transitory computer-readable medium of claim 8, wherein the presence of a metal implant is determined from a manual input, based on the second imaging sequence, or from an MR spectrum acquired from the portion of the body.

* * * * *